United States Patent [19]

Grewal

[11] Patent Number: 5,591,301

[45] Date of Patent: Jan. 7, 1997

[54] PLASMA ETCHING METHOD

[75] Inventor: Virinder S. Grewal, Fishkill, N.Y.

[73] Assignee: Siemens Aktiengesellschaft, Munich, Germany

[21] Appl. No.: 362,398

[22] Filed: Dec. 22, 1994

[51] Int. Cl.$^6$ .............................. H01L 21/00; H05H 1/00
[52] U.S. Cl. .................... 156/643.1; 156/646.1; 156/656.1; 156/653.1
[58] Field of Search .................... 216/68, 72; 156/643.1, 156/646.1, 656.1, 653.1, 657.1; 118/723 I, 723 IR

[56] References Cited

U.S. PATENT DOCUMENTS

| | | | |
|---|---|---|---|
| 4,030,967 | 6/1977 | Ingrey et al. | 156/643 |
| 4,253,907 | 3/1981 | Parry et al. | 156/643 |
| 4,297,162 | 10/1981 | Mundt et al. | 156/643 |
| 4,444,618 | 4/1984 | Saia et al. | 156/643 |
| 4,798,650 | 1/1989 | Nakamura et al. | 156/643 |
| 4,838,992 | 6/1989 | Abraham | 156/643 |
| 5,112,435 | 5/1992 | Wang et al. | 216/79 X |
| 5,201,990 | 4/1993 | Chang et al. | 156/643 |
| 5,223,085 | 6/1993 | Kawai et al. | 156/646 |
| 5,248,636 | 9/1993 | Davis et al. | 437/225 |
| 5,259,922 | 11/1993 | Yamano et al. | 156/643 |
| 5,277,750 | 1/1994 | Frank | 156/643 |
| 5,310,456 | 5/1994 | Kadomura | 156/657 |
| 5,320,704 | 6/1994 | Horioka et al. | 156/626 |
| 5,323,053 | 6/1994 | Luryi et al. | 257/485 |
| 5,346,578 | 9/1994 | Benzing et al. | 118/723 IR |
| 5,401,350 | 3/1995 | Patrick et al. | 118/723 I |
| 5,449,433 | 9/1995 | Donohoe | 156/643.1 |

*Primary Examiner*—Thi Dang
*Attorney, Agent, or Firm*—Adel A. Ahmed

[57] ABSTRACT

A method of plasma etching a gate stack on silicon with a chlorine-containing plasma precursor gas in a vacuum chamber fitted with an electrically conductive planar coil disposed outside the chamber and adjacent to a dielectric window mounted in a wall of the chamber, the conductive planar coil coupled to a first radiofrequency source that matches the impedance of the source to the coil, and a second radiofrequency source coupled to a substrate support mounted in the chamber in a direction parallel to the planar coil which comprises limiting the power during etching to 0–200 watts from the first radiofrequency source and to 50–200 watts from the second radiofrequency source. The resultant etch is anisotropic, and avoids charging of the substrate to be etched. When the gate stack comprises conductive polysilicon, the preferred plasma precursor etch gas is a mixture of hydrogen chloride and chlorine, when a highly selective etch is obtained.

7 Claims, 6 Drawing Sheets

PLASMA ETCHING METHOD

This invention relates to an improved etching method. More particularly, this invention relates to an improved plasma etching method for gate stacks that provides anisotropic etching with high selectivity.

BACKGROUND OF THE INVENTION

In the manufacture of transistors in a semiconductor substrate, such as a silicon wafer, several steps are required to form the gates of the transistors. A first layer of a gate oxide, e.g., silicon oxide, is deposited over the silicon substrate to protect it. Next a conductive, doped polysilicon layer is deposited, optionally followed by a layer of a conductive material such as a refractory metal silicide. A cap layer of silicon oxide or silicon nitride, preferably a silicon oxide produced by the chemical vapor deposition from tetraethoxysilane (TEOS), is also deposited.

A typical gate stack is shown in FIG. 1A wherein a silicon wafer 12 has a layer of gate oxide 13 thereon, followed by a first gate layer of conductive, highly doped polysilicon 14. A second gate layer 15 of a refractory metal silicide, such as titanium silicide or tungsten silicide, and a cap layer 16 of silicon oxide are also deposited.

The gate stack must now be etched to form a gate between the areas in the substrate in which the source and drain will be formed. The silicon oxide hard mask layer 16 is coated with photoresist, the photoresist is patterned, and the silicon oxide layer etched in conventional manner to form a "hard mask". Suitably the etchant for the hard mask is a fluorine-containing gas such as $CHF_3$, $C_2F_6$, $CF_4$ and the like.

FIG. 1B illustrates the gate stack after it has been etched, the same numerals used as in FIG. 1A for the same layers. The silicon oxide hard mask and the gate oxide layer remain, and the two conductive layers are etched.

As devices become smaller and are placed closer together, the gates become correspondingly thinner and narrower. Thus wet etch techniques have been largely replaced by dry etching, particularly plasma etching, because plasma etching is more anisotropic and thus does not undercut the gate, particularly at its intersection with the substrate. Also, plasma etchants can be used that are highly selective; that is, they etch certain materials faster than others. In the case of a gate stack, the etchant must etch the silicide layer and the polysilicon layer, but not silicon oxide; thus the cap layers and the initial gate oxide layers remain intact, as shown in FIG. 1B. Plasma processing is also favored because processing can be carried out at comparatively low temperatures that will not damage the substrate or previously formed devices.

Various vacuum chambers have been designed to carry out plasma etching. One particular design has been disclosed by Ogle in U.S. Pat. No. 4,948,458. The etch apparatus forms a magnetically coupled planar plasma for treatment of a substrate such as a silicon wafer. This apparatus comprises a chamber having a dielectric window. A planar coil is mounted proximate to the window, and an RF power source is coupled to the coil, generally through an impedance matching circuit to maximize power transfer, and a timing circuit to provide resonance at the operating frequency, typically 13.56 MHz. Process gas is supplied to the chamber through an inlet port. When the RF power is turned on, a planar magnetic field is induced which extends into the interior of the chamber through the dielectric window. Thus a circulating flow of electrons is induced in the chamber in a plane parallel to the planar coil, limiting the transfer of kinetic energy in non-planar directions.

A surface support in the chamber supports the substrate to be processed parallel to the plane of the coil, and thus to the plasma. Since the plasma species have little velocity in non-planar directions, the kinetic impact of ionic species on the substrate is small and the predominant reaction is a chemical reaction between the plasma species and the layers on the substrate. This reaction takes place at low temperatures and low pressures.

A detailed description of the above apparatus is shown in FIGS. 2–4. Referring to FIGS. 2, 3 and 4, a plasma treatment system 100 suitable for etching individual semiconductor wafers 110, includes a chamber 112 having an access port 114 formed in an upper wall 116. A dielectric window 118 is disposed below the upper wall 116 and extends across the access port 114. The dielectric window 118 is sealed to the wall 116 to define a vacuum sealed interior 119 of the chamber 112. A planar coil 120 is mounted adjacent to the dielectric window 118. The coil 120 is formed as a spiral having a center tap 122 and an outer tap 124. The plane of the coil 120 is oriented parallel both to the dielectric window 118 and to the support surface 113 upon which the wafer 110 is mounted during etching. The coil 120 is able to produce a planar plasma within the interior 119 of the chamber 112 which is parallel to the wafer 110. A suitable distance between the coil 120 and the support surface 113 can be about 5–10 cm.

A radiofrequency (RF) generator 130 leads to a coaxial cable 132 to a matching circuit 134. The matching circuit 134 includes a primary coil 136 and a secondary loop 138 that may be positioned to adjust the effective coupling of the circuit and allow loading of the circuit at the frequency of operation. The primary coil 136 may be mounted on a disk 140 that can be rotated about a vertical axis 142 to adjust the coupling. A variable capacitor 144 is in series with the secondary loop 138 to adjust the circuit resonant frequency with the frequency output of the RF generator 130. Impedance matching maximizes the efficiency of the power transfer to the planar coil 120. An additional capacitor 146 is provided in the primary circuit to cancel part of the inductive reactance of the primary coil 136 in the circuit.

A second RF potential from a source 172 is applied to the wafer support 113. This RF generator 172 can be operated at a low frequency (below about 550 kHz) or a high frequency (13.56 MHz) but generally a low frequency is employed. The frequency of the RF generator 172 and that of the first RF generator 130 is generally different, and provides a resonant current flow in the coil 120. Thus if the primary RF generator 130 operates at 13.56 MHz, the second RF generator 172 operates suitably at 400 kHz for example. This two RF power source configuration allows control of the amount of energy introduced to the system 100 through the primary RF generator 130 and control of the power output of the RF generator 172 permits control of the velocity imparted to the reactive species in the plasma.

In order to maximize the density of the plasma, and therefore to reduce the time required to perform an etch step, comparatively high power is applied to the planar coil 120, on the order of 300–600 watts. A lower power is applied to the substrate support 113 of about 75–300 watts.

Thus high power provides fast etch rates at a low pressure in the chamber, i.e., 1 Torr or less. Further, since the kinetic energy of ions in such a plasma is low, there is less damage to the wafer.

However, we have found that charging of the wafers processed in the above planar coil apparatus is a problem. A net charge on the substrate support 113 is transferred to the wafer 110 being processed. It is believed this net charge is caused by non-uniformities in the plasma. Further, the selectivity of halogen-containing etchants, such as chlorine, is reduced by a high ion density in the plasma. The high density plasma can also result in undercutting of the wafer stack to be etched. For example, a high density plasma contains, of necessity, a high density of radical species that etch laterally as well as horizontally, causing undercutting of the gates, as shown in FIG. 5, discussed further hereinbelow. In order to reduce this undercutting, it has become common to provide sidewall protection of the gate during further plasma processing. During the course of the etching, to prevent lateral etching and undercutting of the etched gate stack, particularly at the base of the gate stack, it is also known to generate a plasma that, in addition to etching the gate stack, also deposits a protective film on the freshly etched sidewall surfaces. The formation of such layers, which can be polymeric, for example, improves the anisotropy of the etch and prevents undercutting. However, the thickness of this sidewall deposit is difficult to control; if it is too thin, it does not protect the etched sidewalls; and if it is too thick, it takes up more space on the substrate, and impairs the critical dimensions of the gates and their devices. This is unacceptable for submicron design rules.

To perform an etch step in the apparatus of FIGS. 2–4, a process gas is introduced into the chamber 112 through a port 150 formed in the side of the chamber 110. A vacuum exhaust system 152 maintains the pressure in the system and evacuates volatile by-product and unreacted gases.

Thus an improved method of etching gate stacks having good etch rates and good selectivity but improved anisotropy, would be highly desirable.

SUMMARY OF THE INVENTION

I have found that the use of low power in a planar coil vacuum chamber produces a plasma that is very uniform. The use of a precursor gas mixture of chlorine and hydrogen chloride produces a plasma that is selective, and prevents undercutting of gate stacks during etching.

Anisotropic etching of various gate stacks can be obtained, with high uniformity and high selectivity that is able to form submicron lines and spaces.

DETAILED DESCRIPTION OF THE INVENTION

Figure 1A:
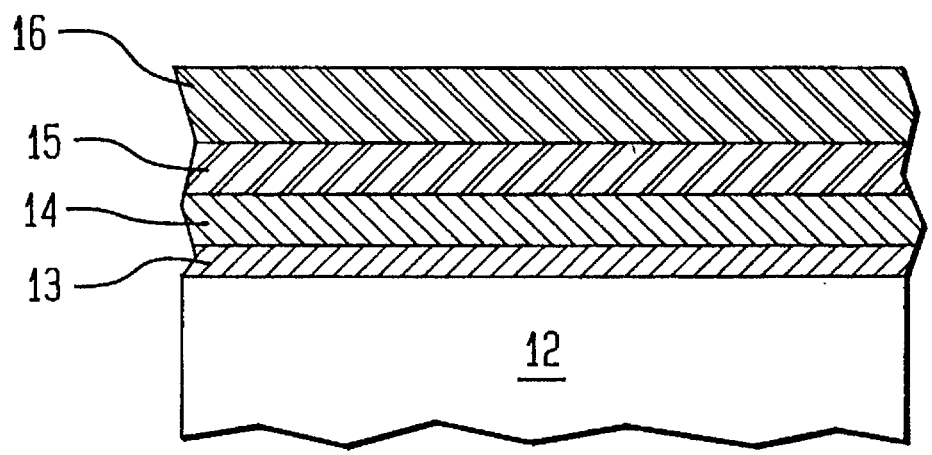
FIG. 1A is a cross sectional view of a substrate having various gate stack layers thereon.
Figure 1B:
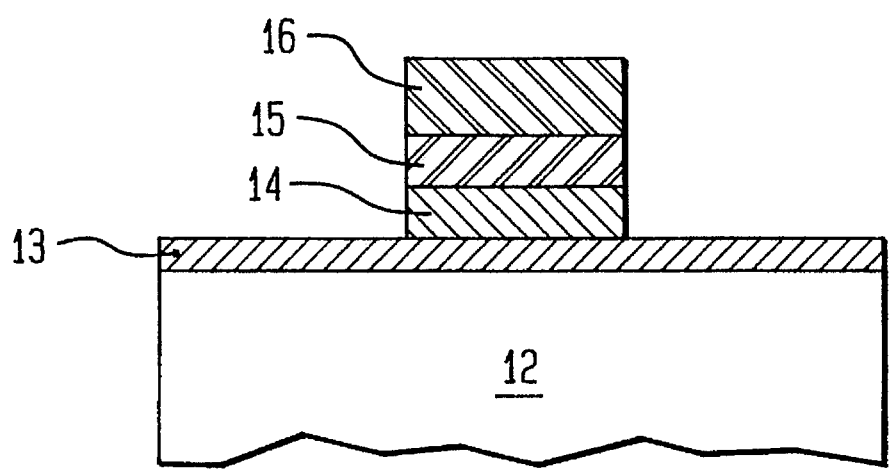
FIG. 1B is a cross sectional view of the substrate of FIG. 1A after etching to form a gate stack.

Gate stacks can be made on a silicon oxide coated silicon substrate for example by depositing a first layer of a doped polysilicon onto a substrate, depositing, as by sputtering, a conductive refractory metal silicide layer, as of TiSi or WSi, and depositing a TEOS silicon oxide cap or hard mask over the silicide, see the above discussion with respect to FIGS. 1A and 1B.

Figure 2:
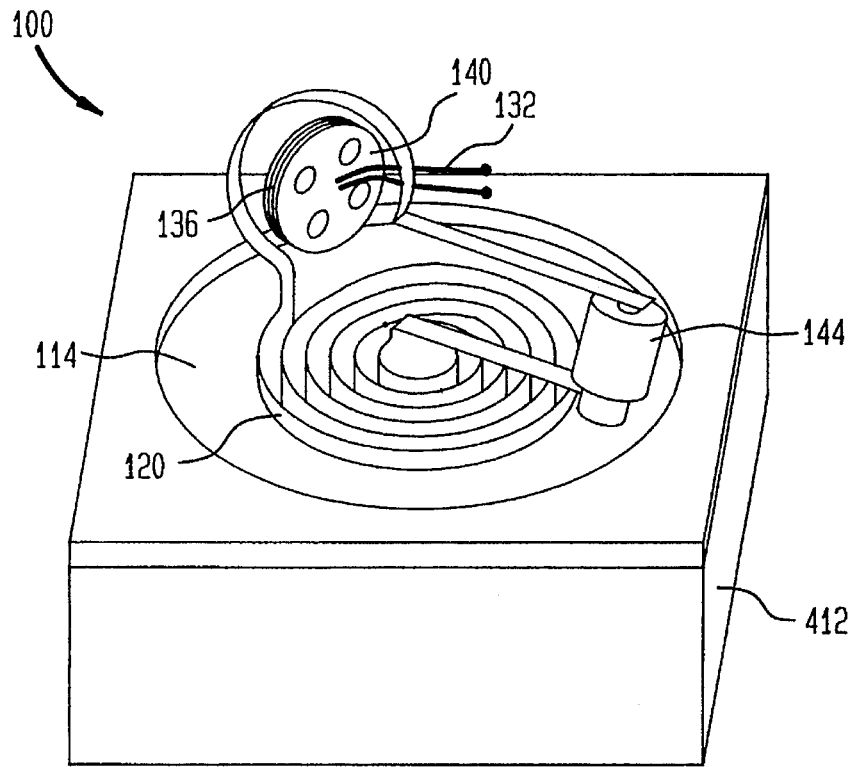
FIG. 2 is an isometric view of an apparatus for producing a planar plasma.
Figure 3:
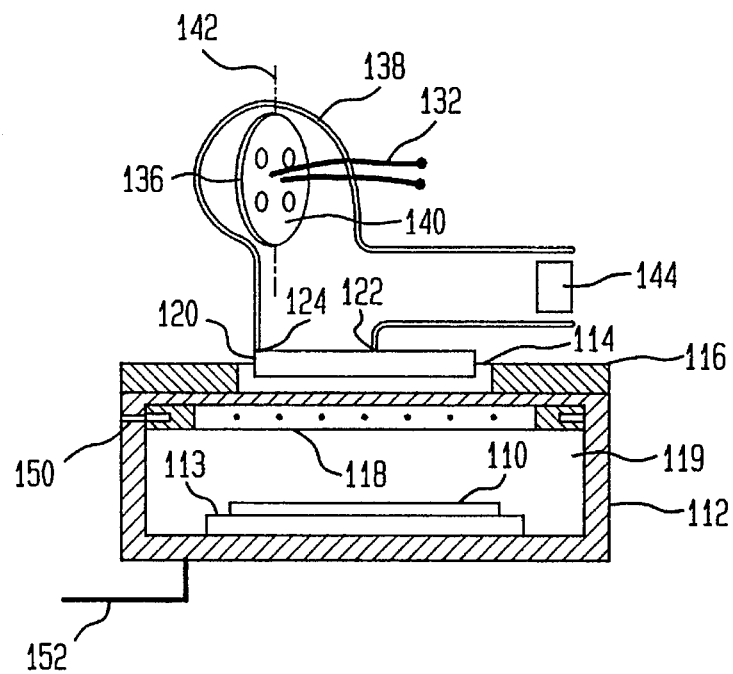
FIG. 3 is a cross sectional view of the apparatus of FIG. 2.
Figure 4:
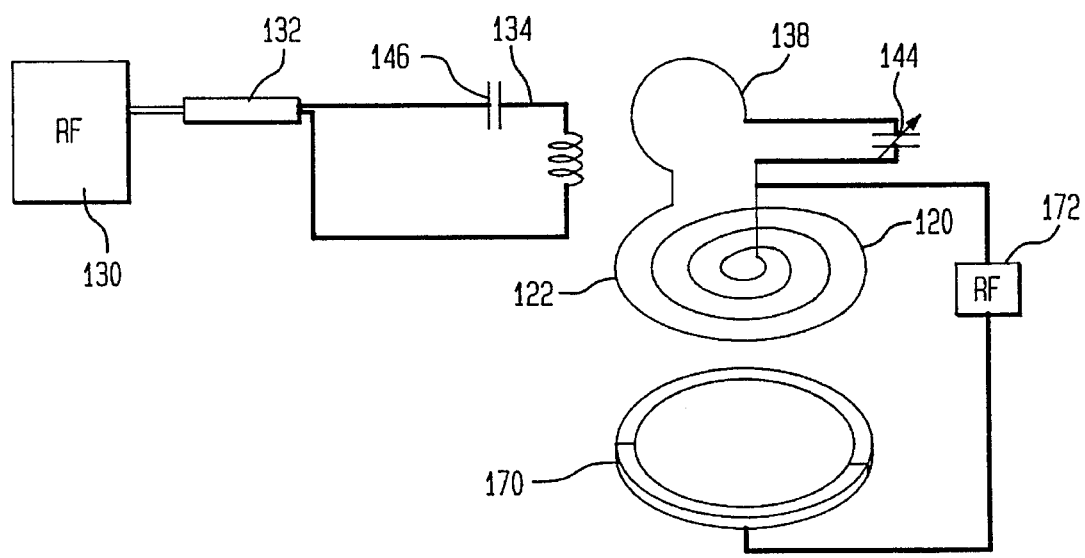
FIG. 4 is a schematic view of the circuitry of the apparatus of FIGS. 2–3 that provides for a radio frequency potential in a direction normal to a resonant coil.

When the above gate stack was etched in an apparatus of FIGS. 2–4, using a conventional etch gas of chlorine (about 50 sccm), nitrogen (about 2–3 sccm) and oxygen (about 2–7 sccm) and generating by means of RF sources comparatively high power of 300–600 watts to the planar coil and about 75–300 watts to the substrate support, the substrate became charged during etching, and the etch profile showed undercutting.

Figure 5:
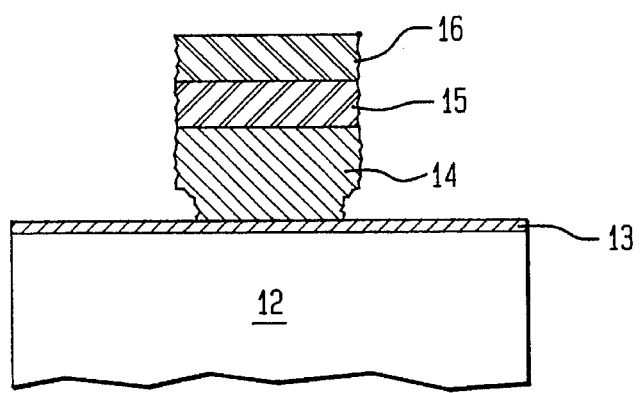
FIG. 5 is a cross sectional view of a substrate having an etched gate stack made by a method of the prior art.

FIG. 5 illustrates the profile of the above etched gate stack, wherein the numerals for the various layers are the same for like materials as for FIGS. 1A and 1B. FIG. 5 illustrates that inadequate sidewall passivation has occurred, resulting in undercutting of both the silicide layer 15 and the polysilicon layer 14. The undercutting of the polysilicon layer 14 is the most marked, and may be due to an increase in activity of plasma radicals near the end of the etch step.

In accordance with the method of the present invention, gate stacks were etched in the apparatus of FIGS. 2–4 using a precursor etch gas of HCl (20–100 sccm), chlorine (20–100 sccm), nitrogen (2–5 sccm) and oxygen (2–5 sccm). Nitrogen and oxygen are added for profile control and sidewall passivation. The addition of oxygen also improves the selectivity of the plasma precursor etch gas mixture to gate oxide. The transferred power to the planar coil was 0–200 watts and the power to the substrate support was 50–200 watts. An etch ratio of 1:1 between the silicide and the polysilicon etch rates was achieved. The etch uniformity across an 8 inch wafer was better than 5%. Etch selectivity to gate oxide of 50–100 can be readily obtained for 50 nm lines and spaces using the above method.

Figure 6:
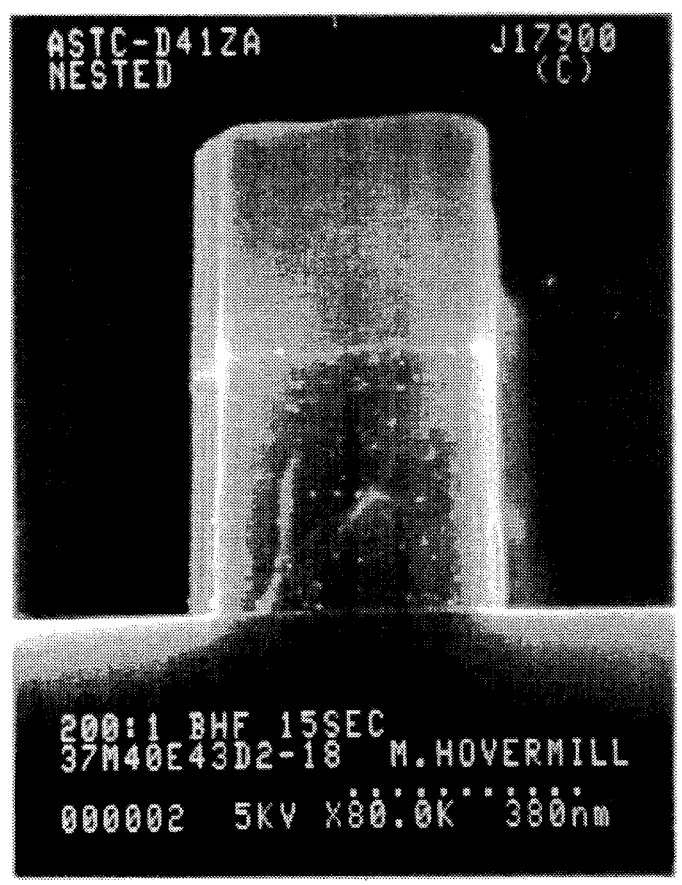
FIGS. 6–8 are photomicrographs of etched gate stacks formed in accordance with the process of the invention.

FIG. 6 is a photomicrograph of an etched gate stack comprising TEOS silicon oxide over n-doped polysilicon. It is apparent that the etch is anisotropic with no undercutting.

Figure 7:
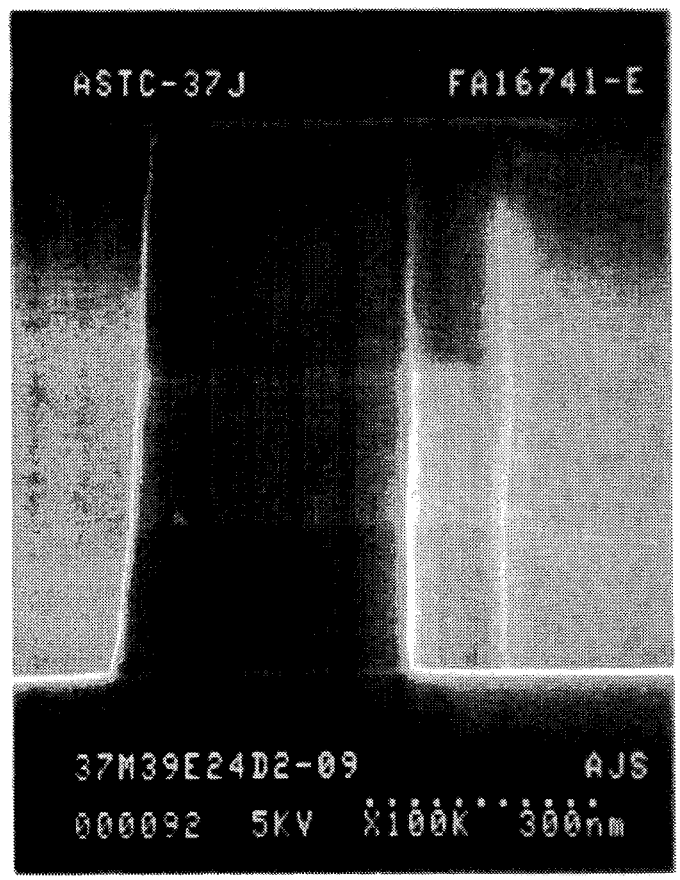

FIG. 7 is a photomicrograph of another gate stack etched using the method of the invention, except that the gate stack includes a first layer of polysilicon, coated with a second sputtered tungsten silicide layer and a TEOS silicon oxide cap layer over the silicide layer. Again, the etch is very anisotropic, with only a very slight undercutting of the polysilicon layer.

Figure 8:
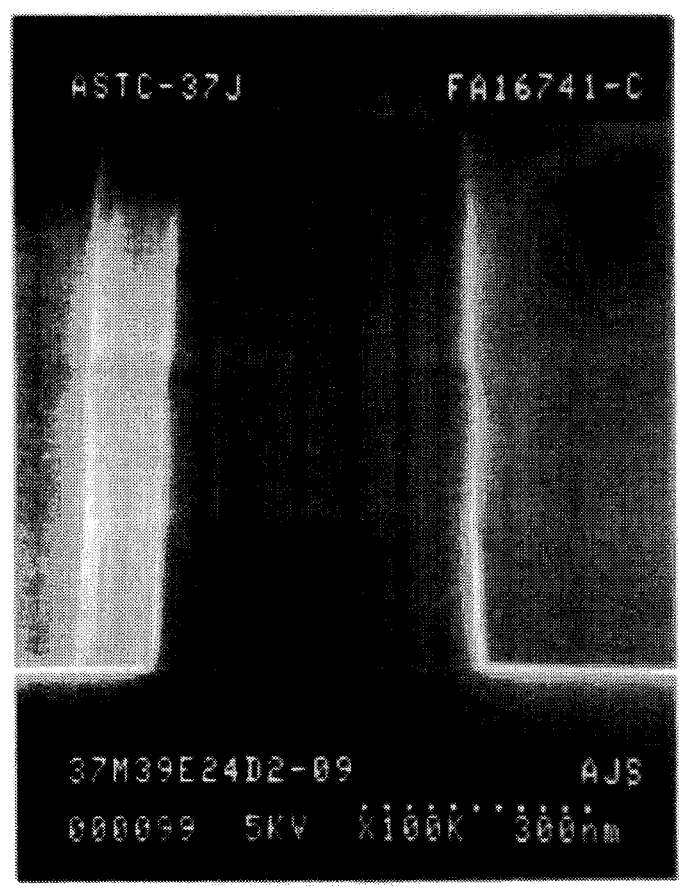

FIG. 8 is a photomicrograph of still another gate stack etched in accordance with the method of the invention, except that this gate stack has a first layer of polysilicon, coated with a sputtered titanium silicide layer and a TEOS silicon oxide cap layer thereover. This etch also is highly anisotropic, with only a small amount of undercutting of the polysilicon layer.

Although the invention has been described in terms of specific embodiments in the specification, one skilled in the art can readily substitute various reaction conditions, gate layers, modified apparatus and the like, which are meant to be included herein. The invention is only meant to be limited by the scope of the appended claims.

I claim:

1. In a method for etching a substrate in a plasma comprising mounting a substrate to be etched in a vacuum chamber, introducing a precursor etch gas into the chamber while maintaining a vacuum pressure in the chamber, and resonating a radiofrequency current in a planar coil located outside of and adjacent to a dielectric window mounted in a wall of said chamber to form a planar plasma substantially parallel to the coil within said chamber, and applying a radiofrequency potential across the planar coil and applying a second, lower frequency radiofrequency potential to the substrate support within said chamber, whereby plasma ions and radicals are accelerated in a direction normal to the planar substrate, the improvement comprising limiting the power to the planar coil to about 1–200 watts and limiting the power to the substrate support to 50–200 watts during the etching.

2. A method according to claim 1 wherein the substrate is silicon having a gate oxide layer thereon, a conductive polysilicon layer is deposited over the gate oxide layer and a cap silicon oxide layer is deposited thereover.

3. A method according to claim 1 wherein the etchant gas is a mixture including chlorine and hydrogen chloride.

4. A method according to claim 3 wherein the etchant gas additionally includes nitrogen and oxygen.

5. A method according to claim 2 wherein a refractory metal silicide layer is deposited over and in contact with the conductive polysilicon layer.

6. A method according to claim 5 wherein said refractory metal silicide is titanium silicide.

7. A method according to claim 5 wherein said refractory metal silicide is tungsten silicide.

* * * * *